(12) United States Patent
Koshimizu

(10) Patent No.: US 12,249,486 B2
(45) Date of Patent: *Mar. 11, 2025

(54) PLASMA PROCESSING APPARATUS AND PLASMA PROCESSING METHOD

(71) Applicant: Tokyo Electron Limited, Tokyo (JP)

(72) Inventor: Chishio Koshimizu, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/392,239

(22) Filed: Dec. 21, 2023

(65) Prior Publication Data

US 2024/0170257 A1 May 23, 2024

Related U.S. Application Data

(63) Continuation of application No. PCT/JP2022/023741, filed on Jun. 14, 2022.

(30) Foreign Application Priority Data

Jun. 21, 2021 (JP) ................................ 2021-102227

(51) Int. Cl.
*H01J 37/32* (2006.01)
(52) U.S. Cl.
CPC .. *H01J 37/32155* (2013.01); *H01J 37/32165* (2013.01); *H01J 37/32183* (2013.01); *H01J 37/32174* (2013.01)
(58) Field of Classification Search
None
See application file for complete search history.

(56) References Cited

U.S. PATENT DOCUMENTS 5,567,268 A * 10/1996 Kadomura ........... H01J 37/3211
430/323
7,736,914 B2 * 6/2010 Liu .................... H01L 21/31116
438/8

(Continued)

FOREIGN PATENT DOCUMENTS

JP 2011-525682 A 9/2011
JP 2018-536251 A 12/2018

(Continued)

OTHER PUBLICATIONS

International Search Report and Written Opinion mailed on Aug. 30, 2022, received for PCT Application PCT/JP2022/023741, filed on Jun. 14, 2022, 12 pages including English Translation.

*Primary Examiner* — Srinivas Sathiraju
(74) *Attorney, Agent, or Firm* — XSENSUS LLP

(57) ABSTRACT

In a plasma processing apparatus, a radio-frequency power supply adjusts frequencies of radio-frequency power in each bias cycle of electrical bias energy. The radio-frequency power supply uses a reference time series of frequencies of the radio-frequency power in each bias cycle. The radio-frequency power supply repeats using a changed time series of frequencies of the radio-frequency power in each bias cycle to increase a degree of match based on an evaluation value. The changed time series results from shifting the reference time series by a phase shift amount, scaling the reference time series in a frequency direction, or scaling two or more of multiple time zones of the reference time series in a time direction.

9 Claims, 14 Drawing Sheets

(56) References Cited

U.S. PATENT DOCUMENTS

| | | | | |
|---|---|---|---|---|
| 7,786,019 B2* | 8/2010 | Koch | ........................ | G03F 1/30 438/723 |
| 8,368,308 B2* | 2/2013 | Banna | ................... | H01J 37/321 315/111.71 |
| 9,378,930 B2* | 6/2016 | Grimbergen | ...... | H01L 21/67069 |
| 11,551,937 B2* | 1/2023 | Yokoyama | ........ | H01L 21/31144 |
| 11,615,964 B2* | 3/2023 | Yokoyama | ........ | H01L 21/32137 438/719 |
| 11,670,488 B2* | 6/2023 | Savas | ................ | H01J 37/32183 315/111.21 |
| 11,749,503 B2* | 9/2023 | Yoshimura | ........ | H01J 37/32165 156/345.35 |
| 11,791,138 B2* | 10/2023 | Cui | ................... | H01J 37/32174 216/61 |
| 11,798,787 B2* | 10/2023 | Fujiwara | ........... | H01J 37/32174 |
| 11,948,780 B2* | 4/2024 | Cui | ................... | H01J 37/32715 |
| 2002/0023837 A1* | 2/2002 | Stimson | ............. | H01J 37/3405 204/298.18 |
| 2005/0106873 A1* | 5/2005 | Hoffman | ........... | H01J 37/32091 438/689 |
| 2005/0241762 A1* | 11/2005 | Paterson | ........... | H01J 37/32165 156/345.28 |
| 2008/0008842 A1* | 1/2008 | Soo | ................... | H01J 37/32165 427/576 |
| 2008/0023443 A1* | 1/2008 | Paterson | ............... | H01J 37/321 216/67 |
| 2008/0142476 A1* | 6/2008 | Koch | ........................ | G03F 1/30 430/5 |
| 2009/0000946 A1* | 1/2009 | Singh | .................... | C23C 14/345 204/298.01 |
| 2009/0142859 A1* | 6/2009 | Liu | .................... | H01J 37/32165 438/694 |
| 2009/0284156 A1* | 11/2009 | Banna | ............... | H01J 37/32155 315/111.21 |
| 2010/0224321 A1* | 9/2010 | Grimbergen | .......... | H01J 37/321 156/345.24 |
| 2010/0227420 A1* | 9/2010 | Banna | ............... | H01L 21/67069 156/345.43 |
| 2010/0276391 A1* | 11/2010 | Grimbergen | ...... | H01J 37/32174 216/41 |
| 2012/0217221 A1* | 8/2012 | Hoffman | ................. | C23C 16/50 216/61 |
| 2013/0110435 A1* | 5/2013 | Leray | .................. | H01L 21/6833 702/65 |
| 2017/0062187 A1* | 3/2017 | Radomski | ......... | H01J 37/32155 |
| 2017/0103873 A1* | 4/2017 | Kawasaki | ......... | H01J 37/32183 |
| 2022/0367157 A1* | 11/2022 | Cui | ................... | H01J 37/32715 |
| 2022/0367158 A1* | 11/2022 | Cui | ................... | H01J 37/32715 |
| 2022/0399185 A1* | 12/2022 | Dhindsa | ............ | H01J 37/32862 |
| 2022/0399194 A1* | 12/2022 | Dhindsa | ............ | H01J 37/32128 |
| 2023/0395360 A1* | 12/2023 | Shihommatsu | ... | H01J 37/32816 |

FOREIGN PATENT DOCUMENTS

| | | | |
|---|---|---|---|
| JP | 2018-536295 A | 12/2018 | |
| WO | WO-2010102161 A2 * | 9/2010 | ............ H01J 37/321 |

* cited by examiner

PLASMA PROCESSING APPARATUS AND PLASMA PROCESSING METHOD

CROSS-REFERENCE TO RELATED APPLICATIONS

This application is a bypass continuation of PCT Application No. PCT/JP2022/023741, filed on Jun. 14, 2022, which claims priority from Japanese Patent Application No. 2021-102227, filed on Jun. 21, 2021, the entire contents of each are incorporated herein by reference.

FIELD

Exemplary embodiments of the present disclosure relate to a plasma processing apparatus and a plasma processing method.

BACKGROUND

Plasma processing is performed on substrates using a plasma processing apparatus. The plasma processing apparatus uses radio-frequency (RF) bias power to draw ions in plasma generated in a chamber toward a substrate. Patent Literature 1 below describes a plasma processing apparatus that modulates the power level and the frequency of RF bias power.

CITATION LIST

Patent Literature

Patent Literature 1: Japanese Unexamined Patent Application Publication No. 2009-246091

BRIEF SUMMARY

Technical Problem

One or more aspects of the present disclosure are directed to a technique for reducing reflection of radio-frequency power used for generating plasma.

Solution to Problem

A plasma processing apparatus according to one exemplary embodiment includes a chamber, a substrate support, a radio-frequency power supply, and a bias power supply. The substrate support is in the chamber. The radio-frequency power supply provides radio-frequency power to generate plasma from a gas in the chamber. The bias power supply provides electrical bias energy to the substrate support to draw ions toward a substrate on the substrate support. The electrical bias energy has a waveform with repeated bias cycles each having a time length being an inverse of a bias frequency. While the radio-frequency power is being provided and the electrical bias energy is being provided to the substrate support, the radio-frequency power supply performs (a) using a predetermined reference time series of frequencies of the radio-frequency power in each of the repeated bias cycles, (b) using, after (a), a changed time series of frequencies of the radio-frequency power in each of the repeated bias cycles, and (c) repeating (b) to increase a degree of match of impedance between the radio-frequency power supply and a load coupled to the radio-frequency power supply based on an evaluation value indicating the degree of match. The changed time series usable by the radio-frequency power supply in (b) is a time series (TS1), a time series (TS2), or a time series (TS3). The time series (TS1) is a time series of frequencies resulting from shifting the reference time series by a phase shift amount for each of the repeated bias cycles. The time series (TS2) is a time series of frequencies resulting from scaling up or down the reference time series in a frequency direction. The time series (TS3) is a time series of frequencies resulting from scaling up or down two or more of a plurality of time zones of the reference time series in a time direction and including as many frequencies as the reference time series.

Advantageous Effects

The plasma processing apparatus according to the above exemplary embodiment reduces reflection of radio-frequency power used for generating plasma.

DETAILED DESCRIPTION

Figure 1:
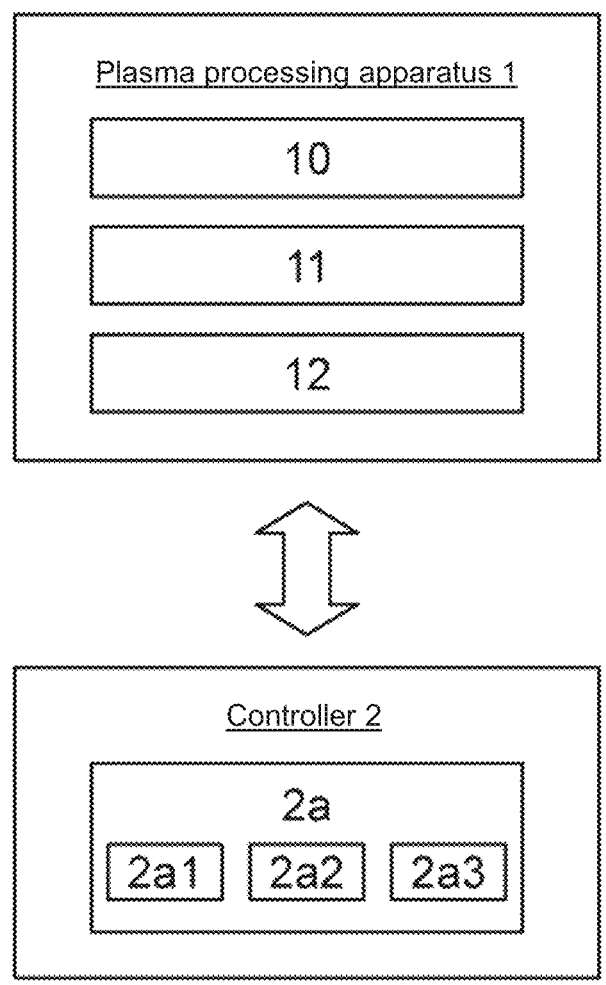
FIG. 1 is a schematic diagram of a plasma processing apparatus according to one exemplary embodiment.

Exemplary embodiments will now be described in detail with reference to the drawings. In the figures, the same or corresponding components are given the same reference numerals.

Figure 2:
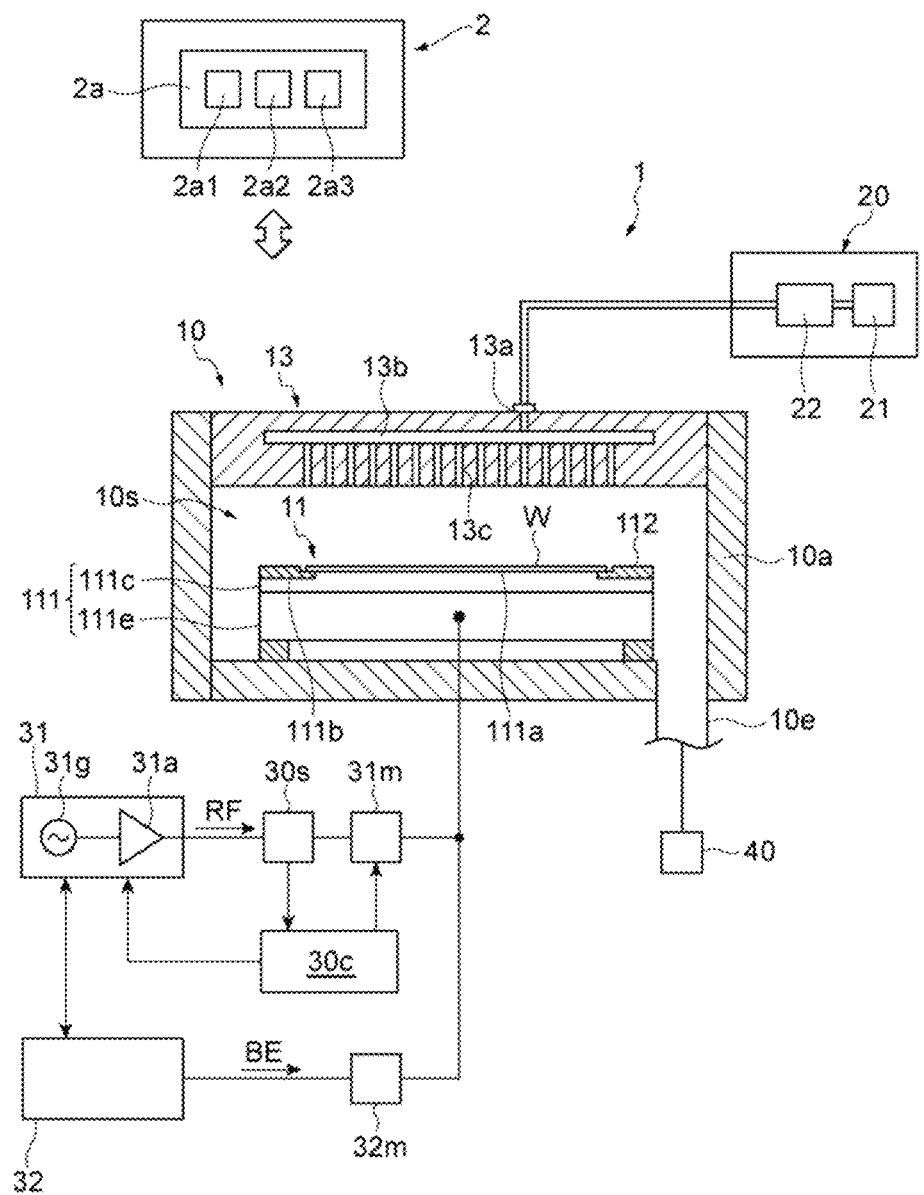
FIG. 2 is a schematic diagram of the plasma processing apparatus according to one exemplary embodiment.

FIGS. 1 and 2 are each a schematic diagram of a plasma processing apparatus according to one exemplary embodiment.

In one embodiment, a plasma processing system includes a plasma processing apparatus 1 and a controller 2. The plasma processing apparatus 1 includes a plasma processing chamber 10, a substrate support 11, and a plasma generator 12. The plasma processing chamber 10 has a plasma processing space. The plasma processing chamber 10 has at least one gas inlet for supplying at least one process gas into the plasma processing space and at least one gas outlet for discharging the gas from the plasma processing space. The gas inlet connects to a gas supply unit 20 (described later). The gas outlet connects to an exhaust system (described later). The substrate support 11 is located in the plasma processing space and has a substrate support surface for supporting a substrate.

The plasma generator 12 generates plasma from at least one process gas supplied into the plasma processing space. The plasma generated in the plasma processing space may be capacitively coupled plasma (CCP), inductively coupled plasma (ICP), electron cyclotron resonance (ECR) plasma, helicon wave plasma (HWP), or surface wave plasma (SWP).

The controller 2 processes computer-executable instructions that cause the plasma processing apparatus 1 to perform various steps described in one or more embodiments of the present disclosure. The controller 2 may control the components of the plasma processing apparatus 1 to perform various steps described herein. In one embodiment, some or all of the components of the controller 2 may be included in the plasma processing apparatus 1. The controller 2 may include, for example, a computer 2a. The computer 2a may include, for example, a central processing unit (CPU) 2a1, a storage 2a2, and a communication interface 2a3. The CPU 2a1 may perform various control operations based on programs stored in the storage 2a2. The storage 2a2 may include a random-access memory (RAM), a read-only memory (ROM), a hard disk drive (HDD), a solid-state drive (SSD), or a combination of these. The communication interface 2a3 may communicate with the plasma processing apparatus 1 with a communication line such as a local area network (LAN).

An example structure of a capacitively coupled plasma processing apparatus as an example of the plasma processing apparatus 1 will now be described. The capacitively coupled plasma processing apparatus 1 includes the plasma processing chamber 10, the gas supply unit 20, and the exhaust system 40. The plasma processing apparatus 1 also includes the substrate support 11 and a gas inlet unit. The gas inlet unit allows at least one process gas to be introduced into the plasma processing chamber 10. The gas inlet unit includes a shower head 13. The substrate support 11 is located in the plasma processing chamber 10. The shower head 13 is located above the substrate support 11. In one embodiment, the shower head 13 defines at least a part of the ceiling of the plasma processing chamber 10. The plasma processing chamber 10 has a plasma processing space 10s defined by the shower head 13, a side wall 10a of the plasma processing chamber 10, and the substrate support 11. The side wall 10a is grounded. The shower head 13 and the substrate support 11 are electrically insulated from a housing of the plasma processing chamber 10.

The substrate support 11 includes a body 111 and a ring assembly 112. The body 111 includes a central area (substrate support surface) 111a for supporting a substrate (wafer) W and an annular area (ring support surface) 111b for supporting the ring assembly 112. The annular area 111b of the body 111 surrounds the central area 111a of the body 111 as viewed in plan. A substrate W is located on the central area 111a of the body 111. The ring assembly 112 is located on the annular area 111b of the body 111 to surround the substrate W on the central area 111a of the body 111. In one embodiment, the body 111 includes a base 111e and an electrostatic chuck (ESC) 111c. The base 111e includes a conductive member that serves as a lower electrode. The ESC 111c is located on the base 111e and has an upper surface including the substrate support surface 111a. The ring assembly 112 includes one or more annular members. At least one of the annular members is an edge ring. Although not shown in the figures, the substrate support 11 may also include a temperature control module that adjusts at least one of the ESC 111c, the ring assembly 112, or the substrate W to a target temperature. The temperature control module may include a heater, a heat transfer medium, a channel, or a combination of these. The channel allows a heat transfer fluid such as brine or gas to flow. The substrate support 11 may include a heat transfer gas supply unit to supply a heat transfer gas into a space between the back surface of the substrate W and the substrate support surface 111a.

The shower head 13 introduces at least one process gas from the gas supply unit 20 into the plasma processing space 10s. The shower head 13 has at least one gas inlet 13a, at least one gas-diffusion compartment 13b, and multiple gas inlet ports 13c. The process gas supplied to the gas inlet 13a passes through the gas-diffusion compartment 13b and is introduced into the plasma processing space 10s through the multiple gas inlet ports 13c. The shower head 13 also includes a conductive member that serves as an upper electrode. In addition to the shower head 13, the gas inlet unit may include one or more side gas injectors (SGIs) that are installed in one or more openings in the side wall 10a.

The gas supply unit 20 may include at least one gas source 21 and at least one flow controller 22. In one embodiment, the gas supply unit 20 allows supply of at least one process gas from each gas source 21 to the shower head 13 through the corresponding flow controller 22. The flow controller 22 may include, for example, a mass flow controller or a pressure-based flow controller. The gas supply unit 20 may further include one or more flow rate modulators that supply at least one process gas at a modulated flow rate or in a pulsed manner.

The exhaust system 40 may be, for example, connected to a gas outlet 10e in the bottom of the plasma processing chamber 10. The exhaust system 40 may include a pressure control valve and a vacuum pump. The pressure control valve regulates the pressure in the plasma processing space 10s. The vacuum pump may include a turbomolecular pump, a dry pump, or a combination of these.

The plasma processing apparatus 1 includes a radio-frequency (RF) power supply 31 and a bias power supply 32. The plasma processing apparatus 1 may further include a controller 30c.

The RF power supply 31 generates radio-frequency power RF to generate plasma in the chamber 10. The radio-frequency power RF has a frequency of, for example, 13 to 150 MHz inclusive. In one embodiment, the RF power supply 31 may include an RF signal generator 31g and an amplifier 31a. The RF signal generator 31g generates an RF signal. The amplifier 31a amplifies the RF signal input from the RF signal generator 31g to generate the radio-frequency power RF, and outputs the radio-frequency power RF.

In one embodiment, the RF power supply 31 is coupled to the base 111e through a matcher 31m. The matcher 31m includes a matching circuit. The matching circuit in the matcher 31m has a variable impedance. The matching circuit in the matcher 31m is controlled by the controller 30c. The matching circuit in the matcher 31m has an impedance adjusted to match the impedance of a load coupled to the RF power supply 31 with the output impedance of the RF power supply 31. The RF power supply 31 may be electrically coupled to another electrode in the substrate support 11. In some embodiments, the RF power supply 31 may be coupled to the upper electrode through the matcher 31*m*.

The bias power supply 32 provides electrical bias energy BE to the substrate support 11 to draw ions toward the substrate W on the substrate support 11. The bias power supply 32 is coupled to a bias electrode in the substrate support 11. The bias electrode may be the base 111*e*. The bias electrode may be an electrode other than the base 111*e* in the substrate support 11. The bias power supply 32 and the RF power supply 31 may be electrically coupled to the same electrode in the substrate support 11 or to different electrodes in the substrate support 11.

The electrical bias energy BE has a waveform with repeated cycles CY (waveform cycles) having a time length being the inverse of a bias frequency. The bias frequency is, for example, 100 kHz to 13.56 MHz inclusive.

Figure 5:
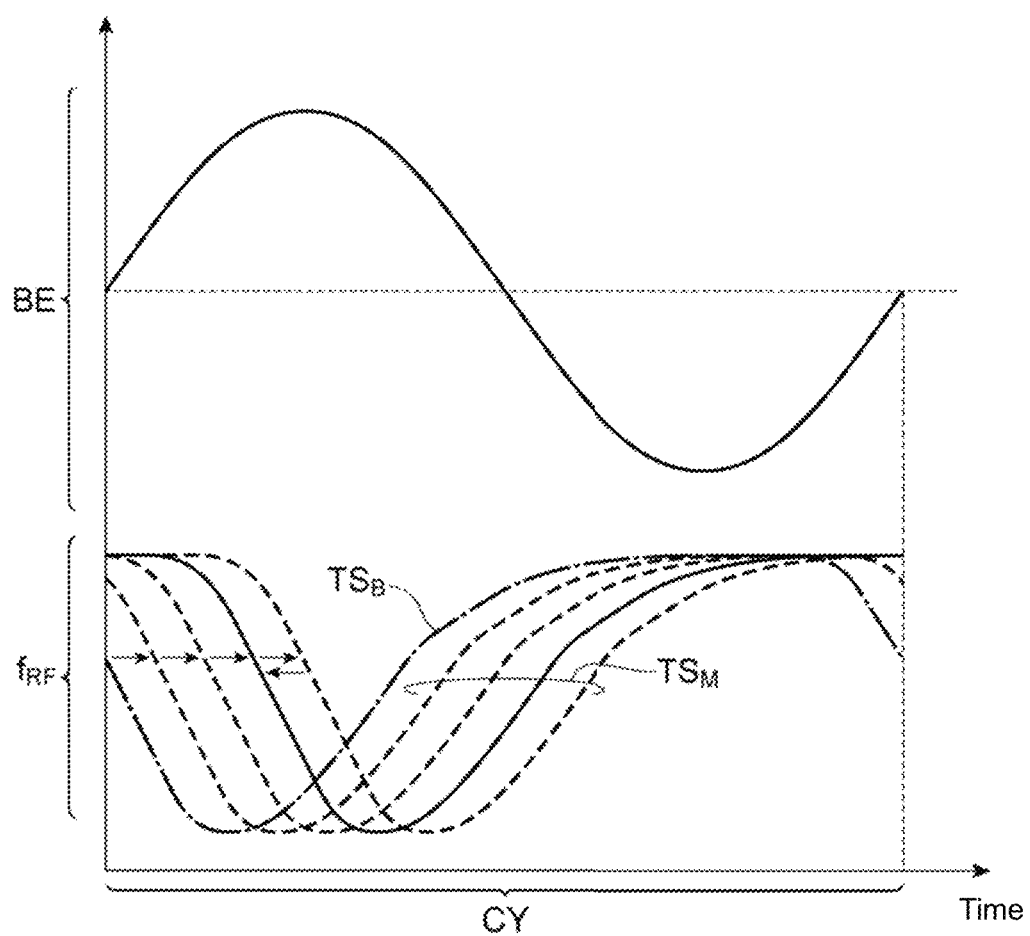
FIG. 5 is a graph describing step ST3 in the first example shown in FIG. 4.

As shown in, for example, FIG. 5, the electrical bias energy BE in one embodiment may be RF power having the bias frequency, or RF bias power. The RF bias power has a sinusoidal waveform in the cycles CY, or bias cycles. Each cycle CY has a time length being the inverse of the bias frequency. When RF bias power is used as the electrical bias energy BE, the bias power supply 32 is coupled to the bias electrode through a matcher 32*m*. The matcher 32*m* includes a matching circuit. The matching circuit in the matcher 32*m* has a variable impedance. The matching circuit in the matcher 32*m* is controlled by the controller 30*c*. The matching circuit in the matcher 32*m* has an impedance adjusted to match the impedance of a load coupled to the bias power supply 32 with the output impedance of the bias power supply 32.

In another embodiment, the electrical bias energy BE may be voltage pulses generated periodically at time intervals (cycles CY) with the time length being the inverse of the bias frequency. The electrical bias energy BE may be pulses of a negative voltage or pulses of a negative direct current voltage. The voltage pulses may have a triangular or square waveform, or any other waveform. When voltage pulses are used as the electrical bias energy BE, the matcher 32*m* may be replaced with a filter coupled between the bias power supply 32 and the bias electrode to block the radio-frequency power RF.

In plasma processing apparatus 1, each cycle CY is divided into multiple phase periods SP. The plasma processing apparatus 1 adjusts frequencies $f_{RF}$ of the radio-frequency power RF for each of the multiple phase periods SP in each cycle CY while the radio-frequency power RF is being provided and the electrical bias energy BE is being provided to the substrate support 11. The RF power supply 31 and the bias power supply 32 are synchronized with each other using a synchronization signal that may be provided from the bias power supply 32 to the RF power supply 31. In some embodiments, the synchronization signal may be provided from the RF power supply 31 or the RF signal generator 31*g* to the bias power supply 32.

The controller 30*c* controls the RF power supply 31. The controller 30*c* may include a processor such as a CPU. The controller 30*c* may be a part of the matcher 31*m* or a part of the RF power supply 31. The controller 30*c* may be separate from the matcher 31*m* and from the RF power supply 31. In some embodiments, the controller 2 may also serve as the controller 30*c*.

Adjusting the frequencies of the radio-frequency power RF in each cycle CY performed by the RF power supply 31 will now be described. A plasma processing method according to one exemplary embodiment will also be described. The frequencies of the radio-frequency power RF may be adjusted by the controller 30*c* controlling the RF power supply 31 as described below.

Figure 3:
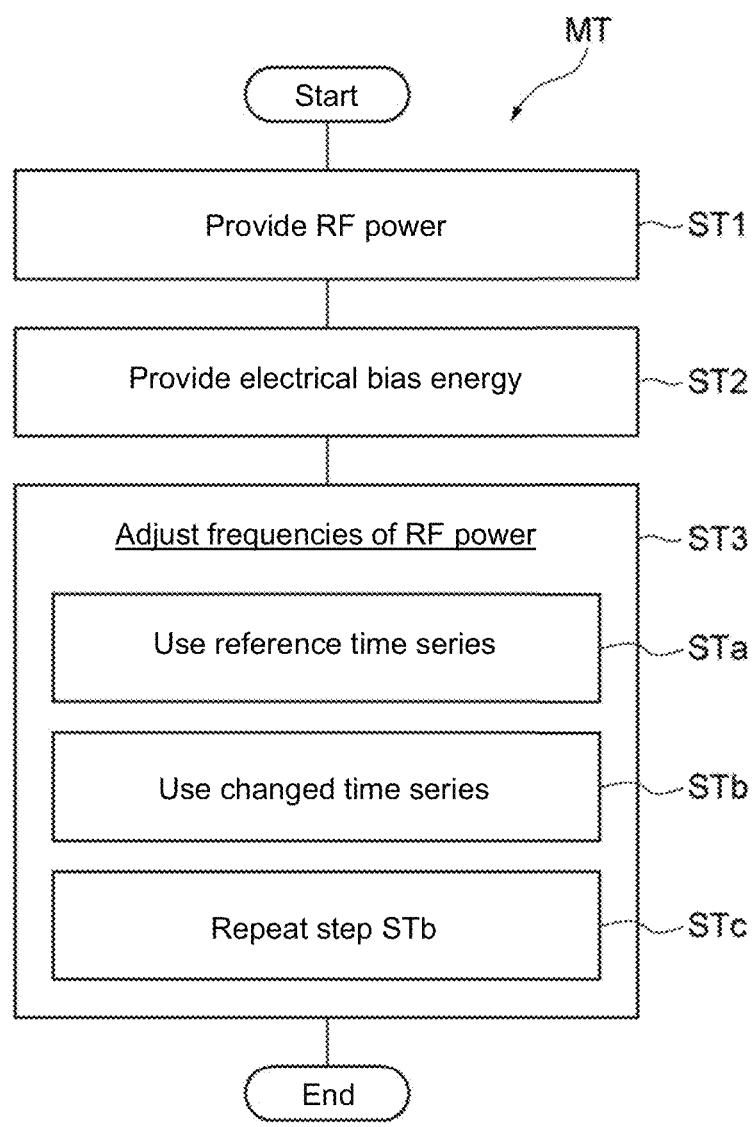
FIG. 3 is a flowchart of a plasma processing method according to one exemplary embodiment.

FIG. 3 is a flowchart of a plasma processing method according to one exemplary embodiment. The plasma processing method shown in FIG. 3 (hereafter referred to as a method MT) includes steps ST1 to ST3. Steps ST1 to ST3 may be performed by the controller 2 controlling the components of the plasma processing apparatus 1. While steps ST1 to ST3 are being performed with the method MT, the gas supply unit 20 supplies a gas into the chamber 10, and the exhaust system 40 adjusts the pressure in the chamber as specified.

In step ST1, the radio-frequency power RF is provided from the RF power supply 31 to generate plasma from the gas in the chamber 10. Step ST2 is performed in parallel with step ST1. In step ST2, the electrical bias energy BE is provided to the substrate support 11 to draw ions toward the substrate on the substrate support 11. In one embodiment, the electrical bias energy BE is provided to the base 111*e*. Step ST3 is performed while the radio-frequency power RF is being provided and the electrical bias energy BE is being provided to the substrate support 11, or in other words, while steps ST1 and ST2 are being performed. In step ST3, the frequencies $f_{RF}$ of the radio-frequency power RF in each cycle CY are adjusted.

Step ST3 includes steps STa to STc. In step STa, a predetermined reference time series $TS_B$ of frequencies is used as a time series of frequencies $f_{RF}$ of the radio-frequency power RF in each cycle CY. More specifically, the time series of frequencies $f_{RF}$ includes multiple frequencies of the radio-frequency power RF that are used for the respective multiple phase periods SP in each cycle CY. The time series of frequencies $f_{RF}$ used by the RF power supply 31 may be specified by the controller 30*c*. The reference time series $TS_B$ is prepared in a frequency setting period $P_{fset}$ before step ST1 is performed with the method MT. Preparing the reference time series $TS_B$ in the frequency setting period $P_{fset}$ will be described later.

Step STb is then performed. In step STb, a changed time series $TS_M$ is used as the frequencies $f_{RF}$ of the radio-frequency power RF in each cycle CY. The multiple frequencies included in the time series $TS_M$ are used as the frequencies of the radio-frequency power RF for the respective multiple phase periods SP in each cycle CY. The time series $TS_M$ used in step STb may be specified by the controller 30*c*. In step STc, step STb is repeated to increase the degree of match of impedance between the RF power supply 31 and the load coupled to the RF power supply 31 based on an evaluation value indicating the degree of match.

The time series $TS_M$ used in step STb is a time series TS1, a time series TS2, or a time series TS3. The time series TS1 is a time series of frequencies resulting from shifting the reference time series $TS_B$ by a phase shift amount for each cycle CY. The time series TS2 is a time series of frequencies resulting from scaling (specifically, scaling up or down) the reference time series $TS_B$ in the frequency direction. Time series TS3 is a time series of frequencies including as many frequencies as the reference time series $TS_B$. The time series TS3 is a time series of frequencies resulting from scaling (scaling up or down) two or more of multiple time zones of the reference time series $TS_B$ in the time direction.

The evaluation value is determined by the controller 30*c* based on measurement values obtained by a sensor 30*s*. The evaluation value may be a single representative value indicating the degree of match in an evaluation period in which the time series are used in step STb. The evaluation period may be longer than or equal to the time length of the cycle CY. The evaluation value may be the integral, the average, or the peak of measurement values in the evaluation period or of values obtained based on such measurement values.

The sensor 30s may be a directional coupler that measures the power levels of reflected waves of the radio-frequency power RE. In this case, the measurement values are the power levels of reflected waves of the radio-frequency power RF. The evaluation value is a representative value of the power levels of reflected waves or of the ratios of the power levels of reflected waves to the output level of the radio-frequency power RF of the RF power supply 31 in the evaluation period. The evaluation value may be the integral, the average, or the peak of the power levels of reflected waves or of the ratios of the power levels of reflected waves to the output level of the radio-frequency power RF of the RF power supply 31 in the evaluation period. In this case, the sensor 30s is coupled between the RF power supply 31 and the load coupled to the RF power supply 31. The sensor 30s may be coupled between the RF power supply 31 and the matcher 31m.

In some embodiments, the sensor 30s may be a voltage-current sensor. The sensor 30s measures voltages and currents in a feed line for providing the radio-frequency power RF to the chamber 10. The sensor 30s is coupled between the RF power supply 31 and the load coupled to the RF power supply 31. The sensor 30s may be coupled between the RF power supply 31 and the matcher 31m. In some embodiments, the sensor 30s may be a part of the matcher 31m. In this case, the measurement values are voltages and currents. The evaluation value may be a representative value of the phase differences between the voltages and currents in the evaluation period. For example, the evaluation value may be the integral, the average, or the peak of the phase differences between the voltages and currents in the evaluation period. In some embodiments, the evaluation value may be a representative value of impedances determined based on the voltages and currents in the evaluation period or of the resistive components of such impedances. For example, the evaluation value may be the integral, the average, or the peak of impedances determined based on the voltages and currents in the evaluation period or of the resistive components of such impedances.

Examples of step ST3 will now be described.

First Example

Figure 4:
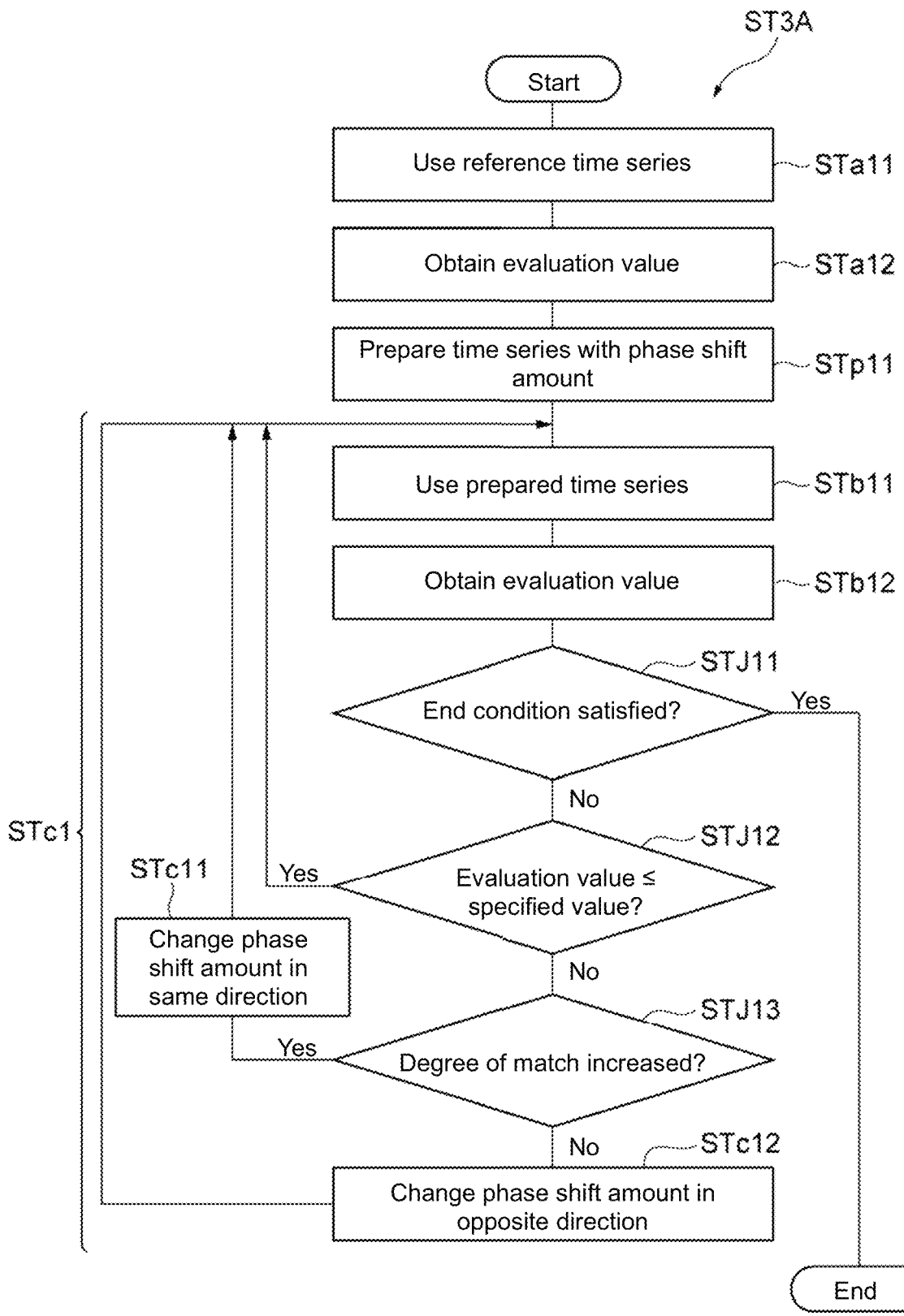
FIG. 4 is a flowchart of a plasma processing method according to one exemplary embodiment, showing step ST3 in a first example.

Step ST3 in a first example will now be described with reference to FIGS. 4 and 5. FIG. 4 is a flowchart of a plasma processing method according to one exemplary embodiment, showing step ST3 in the first example. FIG. 5 is a graph describing step ST3 in the first example shown in FIG. 4. In FIG. 5, the horizontal axis indicates time, and the vertical axis indicates the electrical bias energy BE and the frequency $f_{RF}$ of the radio-frequency power RF. FIG. 5 shows the waveform of the electrical bias energy BE in a cycle CY. FIG. 5 also shows the reference time series $TS_B$ and changed time series $TS_M$ used as the frequencies $f_{RF}$ of the radio-frequency power RF for the respective multiple phase periods SP in the cycle CY. In step ST3 (step ST3A) in the first example, the time series TS1 described above is used as the changed time series $TS_M$.

As shown in FIG. 4, step ST3A starts from step STa11. In step STa11, the reference time series $TS_B$ is used as the time series of frequencies $f_{RF}$ of the radio-frequency power RF in each cycle CY, as described above with reference to step STa.

Step STa12 is then performed. In step STa12, the evaluation value is obtained. The evaluation value is determined based on measurement values obtained by the sensor 30s, as described above. The evaluation value is determined by the controller 30c.

Step STp11 is then performed. In step STp11, the time series $TS_M$ is prepared by shifting the reference time series $TS_B$ by a phase shift amount for each cycle CY. The time series $TS_M$ is prepared by the controller 30c and specified for the RF power supply 31.

Step STb11 is then performed. In step STb11, the prepared time series $TS_M$ is used as the frequencies $f_{RF}$ of the radio-frequency power RF in each cycle CY, as described above with reference to step STb. In step STc1, step STb11 is repeated while the phase shift amount is being changed.

In step STc1, step STb11 is followed by step STb12. In step STb12, the evaluation value is obtained for the period (evaluation period) in which step STb11 is performed. The evaluation value is determined by the controller 30c based on measurement values obtained by the sensor 30s, as described above.

In step STc1, step STJ11 is then performed. In step STJ11, the determination is performed as to whether an end condition is satisfied. The determination in step STJ11 is performed by the controller 30c. In step STJ11, the end condition is satisfied in response to an instruction of the controller 2 for ending the plasma processing.

When the end condition is not satisfied in step STJ11, step STJ12 is performed. In step STJ12, the determination is performed as to whether the evaluation value obtained in step STb12 is less than or equal to a specified value. The determination in step STJ12 is performed by the controller 30c. An evaluation value less than or equal to the specified value indicates the degree of match being acceptable. When the evaluation value is less than or equal to the specified value in step STJ12, the processing in step STb11 and subsequent steps is repeated. When the evaluation value is greater than the specified value in step STJ12, step STJ13 is performed.

In step STJ13, the determination is performed as to whether the degree of match has increased based on the comparison between the evaluation value obtained in step STb12 and the evaluation value obtained in the immediately preceding cycle. The determination in step STJ13 is performed by the controller 30c. When the degree of match has increased in step STJ13, step STc11 is performed. When the degree of match has not increased in step STJ13, step STc12 is performed.

In step STc11, the phase shift amount is changed in the same direction as the phase shift amount used in the immediately preceding cycle. When the phase shift amount used in the immediately preceding cycle is increased from the phase shift amount used in the further preceding cycle, the phase shift amount is increased in step STc11 as indicated by the right arrows in FIG. 5. When the phase shift amount used in the immediately preceding cycle is decreased from the phase shift amount used in the further preceding cycle, the phase shift amount is decreased in step STc11. The reference time series $TS_B$ is shifted by the changed phase shift amount, thus preparing the time series $TS_M$. The time series $TS_M$ is prepared by the controller 30c and specified for the RF power supply 31. Step STb11 is then performed again.

In step STc12, the phase shift amount is changed in the direction opposite to the direction for the phase shift amount used in the immediately preceding cycle. When the phase shift amount used in the immediately preceding cycle is increased from the phase shift amount used in the further preceding cycle, the phase shift amount is decreased in step STc12 as indicated by the left arrows in FIG. 5. When the phase shift amount used in the immediately preceding cycle is decreased from the phase shift amount used in the further preceding cycle, the phase shift amount is increased in step STc12. The reference time series $TS_B$ is shifted by the changed phase shift amount, thus preparing the time series $TS_M$. The time series $TS_M$ is prepared by the controller 30c and specified for the RF power supply 31. Step STb11 is then performed again.

When the end condition is satisfied in step STJ11 after repeated step STb11, step ST3A ends.

Second Example

Figure 6:
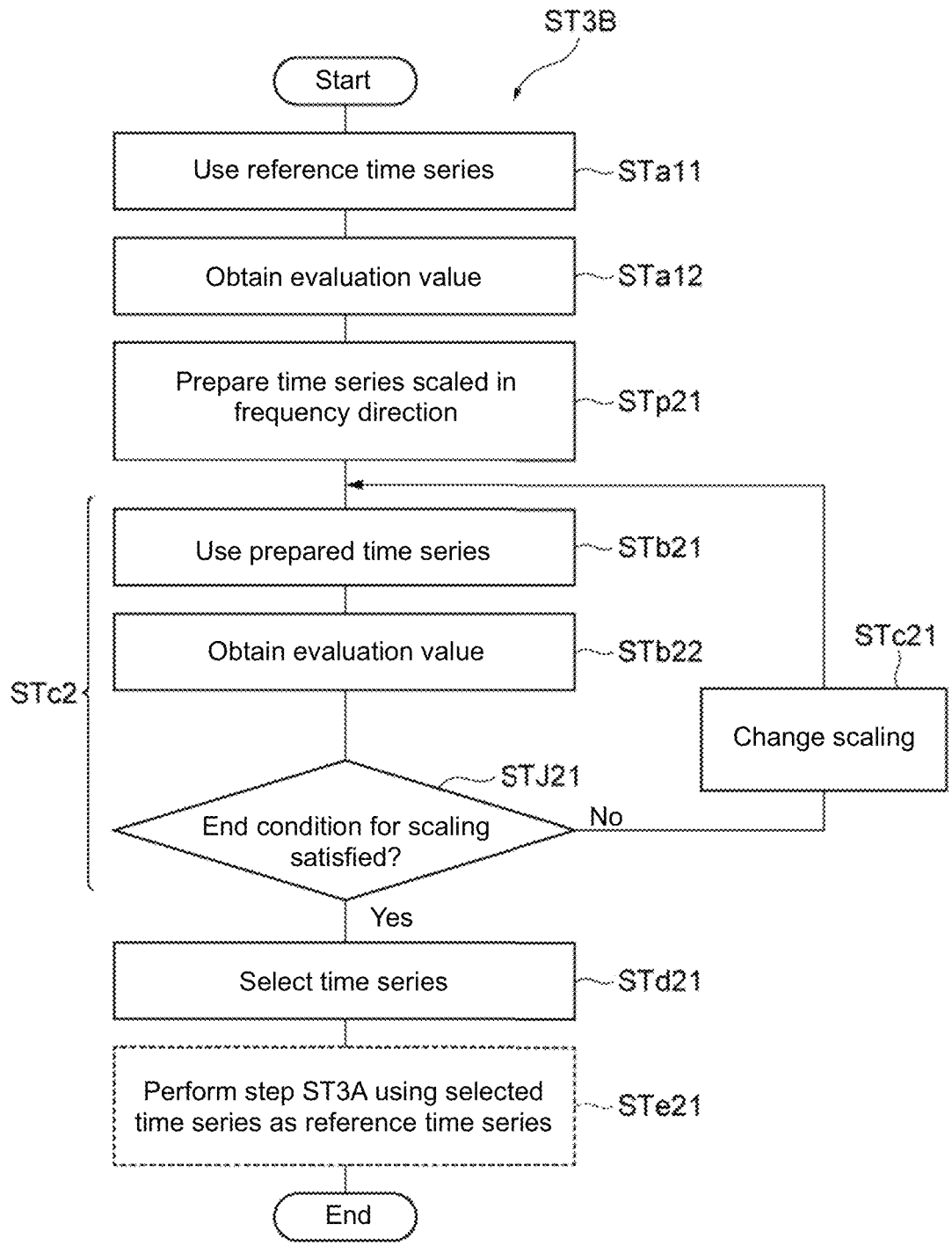
FIG. 6 is a flowchart of a plasma processing method according to one exemplary embodiment, showing step ST3 in a second example.

Step ST3 in a second example will now be described with reference to FIGS. 6 to 10. FIG. 6 is a flowchart of a plasma processing method according to one exemplary embodiment, showing step ST3 in the second example. FIGS. 7 to 10 are each a graph describing step ST3 in the second example shown in FIG. 6. In each of FIGS. 7 to 10, the horizontal axis indicates time, and the vertical axis indicates the electrical bias energy BE and the frequency $f_{RF}$ of the radio-frequency power RF. Each of FIGS. 7 to 10 shows the waveform of the electrical bias energy BE in a cycle CY. Each of FIGS. 7 to 10 also shows the reference time series $TS_B$ and changed time series $TS_M$ used as the frequencies $f_{RF}$ of the radio-frequency power RF for the respective multiple phase periods SP in the cycle CY. In step ST3 (step ST3B) in the second example, the time series TS2 described above is used as the changed time series $TS_M$.

As shown in FIG. 6, step ST3B starts from step STa11 similarly to step ST3A. Step STa12 is then performed similarly to step ST3A.

Step STp21 is then performed. In step STp21, the time series $TS_M$ is prepared by scaling (specifically, scaling up or down) the reference time series $TS_B$ in the frequency direction. The time series $TS_M$ is prepared by the controller 30c and specified for the RF power supply 31.

Figure 7:
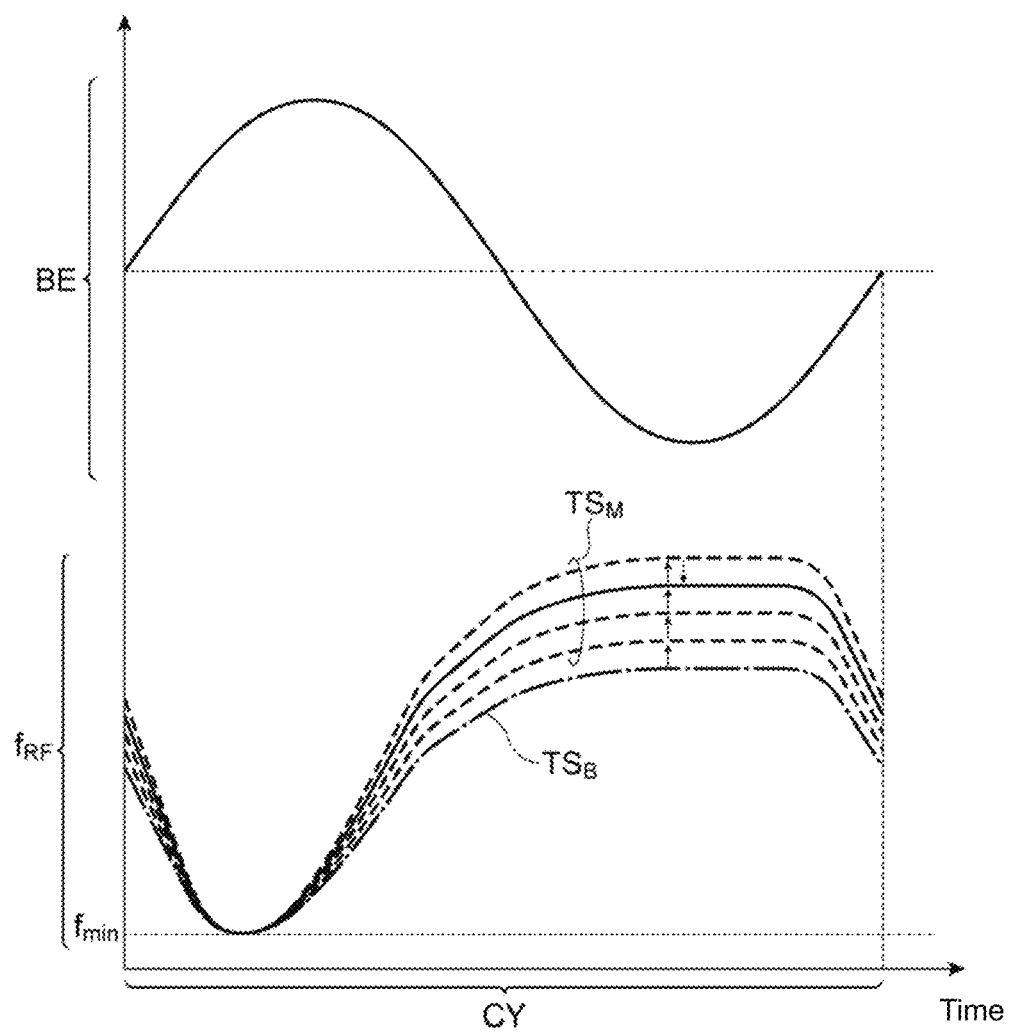
FIG. 7 is a graph describing step ST3 in the second example shown in FIG. 6.
Figure 8:
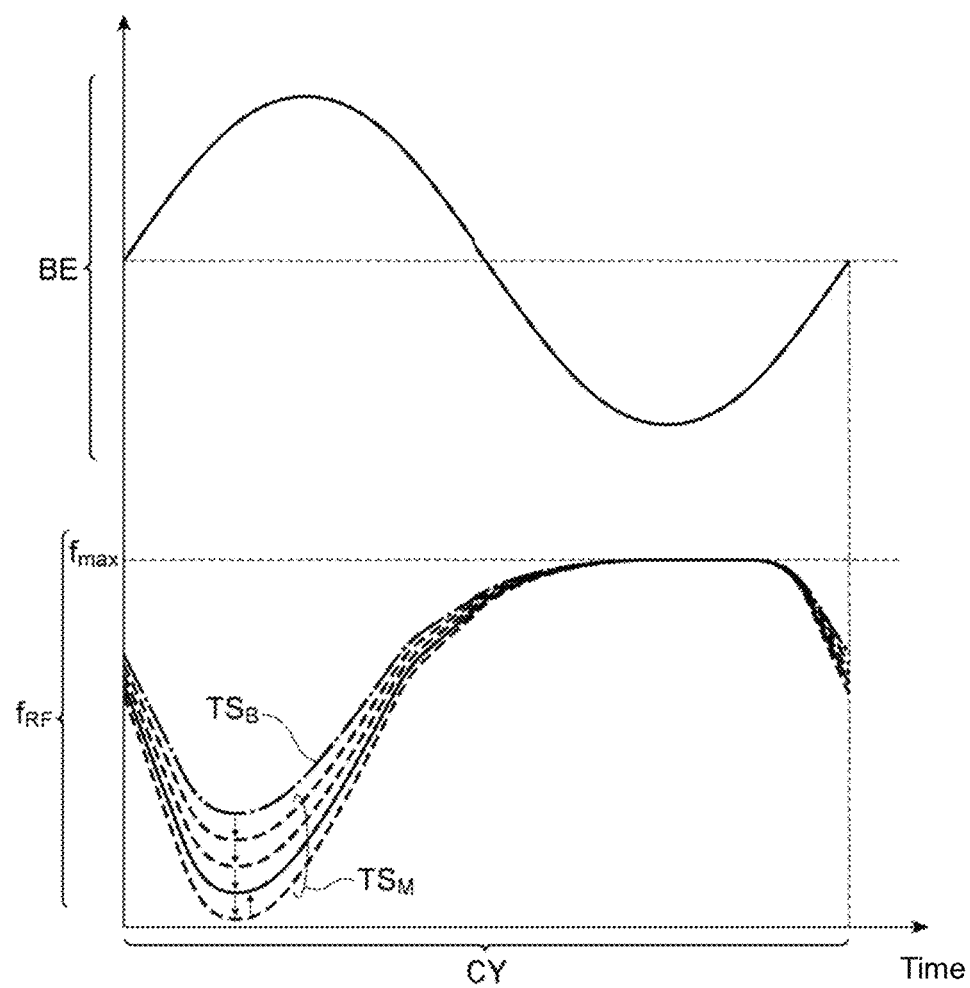
FIG. 8 is a graph describing step ST3 in the second example shown in FIG. 6.
Figure 9:
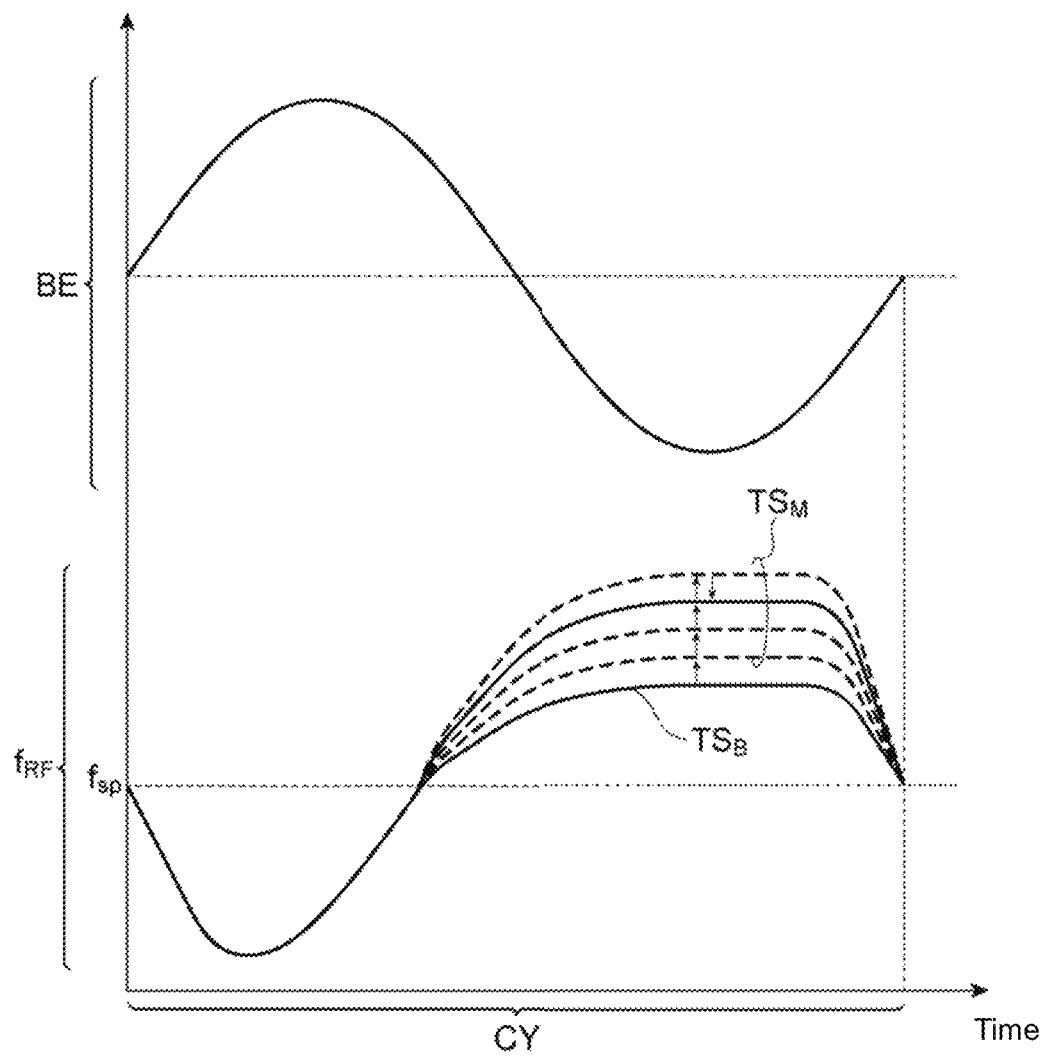
FIG. 9 is a graph describing step ST3 in the second example shown in FIG. 6.
Figure 10:
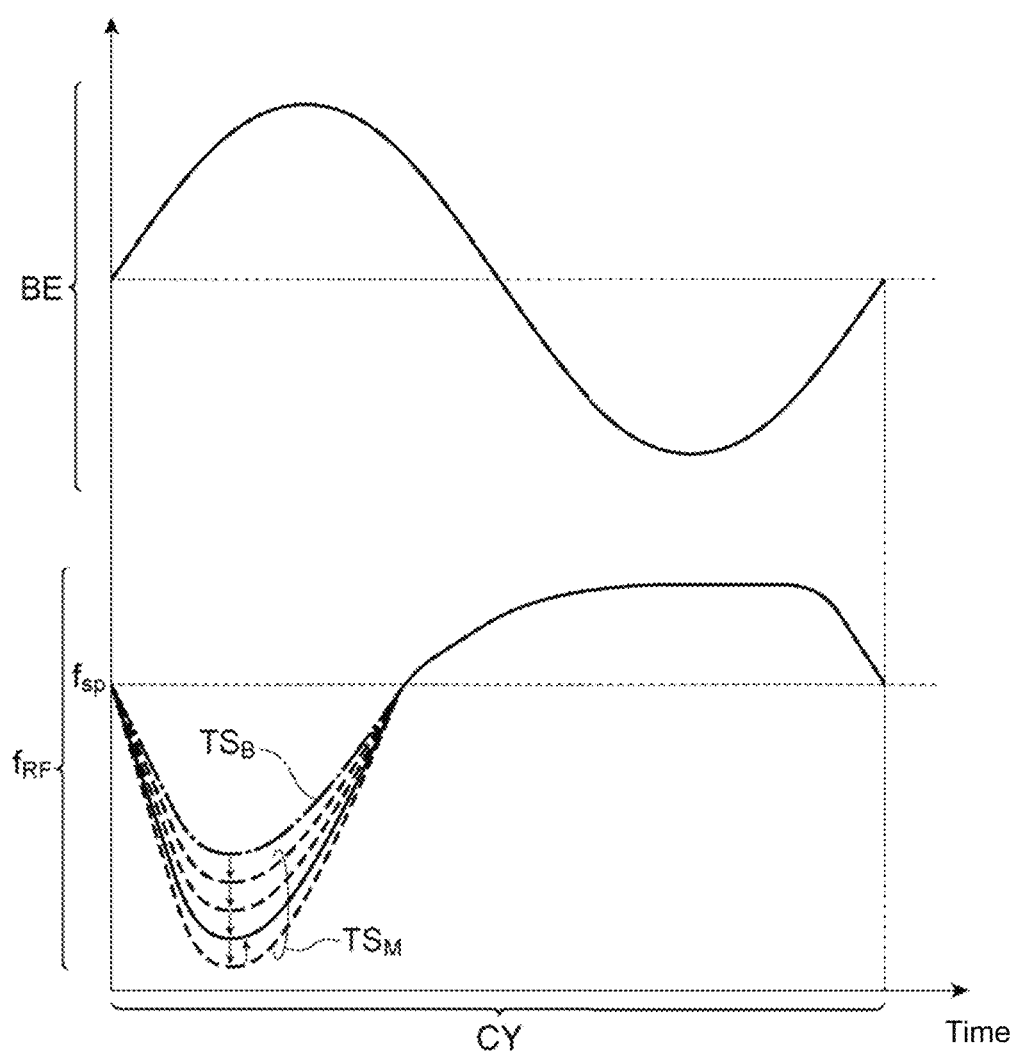
FIG. 10 is a graph describing step ST3 in the second example shown in FIG. 6.

The time series $TS_M$ prepared in step STp21 may result from scaling the reference time series $TS_B$ in the frequency direction while maintaining the minimum frequency $f_{min}$ in the reference time series $TS_B$, as shown in FIG. 7. The time series changed as shown in FIG. 7 is hereafter referred to as a time series TS21. The time series $TS_M$ prepared in step STp21 may result from scaling the reference time series $TS_B$ in the frequency direction while maintaining the maximum frequency $f_{max}$ in the reference time series $TS_B$, as shown in FIG. 8. The time series changed as shown in FIG. 8 is hereafter referred to as a time series TS22. The time series $TS_M$ prepared in step STp21 may result from scaling the reference time series $TS_B$ in the frequency direction while maintaining the frequencies lower than or equal to a specified frequency $f_{sp}$ in the reference time series $TS_B$, as shown in FIG. 9. The time series changed as shown in FIG. 9 is hereafter referred to as a time series TS23. The time series $TS_M$ prepared in step STp21 may result from scaling the reference time series $TS_B$ in the frequency direction while maintaining the frequencies higher than or equal to the specified frequency $f_{sp}$ in the reference time series $TS_B$, as shown in FIG. 10. The time series changed as shown in FIG. 10 is hereafter referred to as a time series TS24.

Step STb21 is then performed. In step STb21, the prepared time series $TS_M$ is used as the frequencies $f_{RF}$ of the radio-frequency power RF in each cycle CY, as described above with reference to step STb. In step STc2, step STb21 is repeated. In repeated step STb21, the RF power supply 31 changes the scaling factor for the reference time series $TS_B$ in the frequency direction.

In repeated step STb21, any one of the time series TS21 to TS24 may be used while the scaling factor is being changed. In repeated step STb21, the time series TS21 to TS24 may be used sequentially while the scaling factor is being changed.

In step STc2, step STb21 is followed by step STb22. Step STb22 is the same as step STb12.

In step STc2, step STb22 is followed by step STJ21. In step STJ21, the determination is performed as to whether an end condition for scaling is satisfied. The determination in step STJ21 is performed by the controller 30c. In step STJ21, the end condition for scaling is satisfied when step STb21 has been repeated a predetermined number of times.

When the end condition for scaling is not satisfied in step STJ21, step STc21 is performed. In step STc21, the scaling factor for the reference time series $TS_B$ is changed in the frequency direction as indicated by the arrows in FIGS. 7 to 10, thus preparing the time series $TS_M$. The time series $TS_M$ is prepared by the controller 30c and specified for the RF power supply 31. When the end condition for scaling is satisfied in step STJ21, step STd21 is performed.

In step STd21, the time series $TS_M$ (first time series) that causes the greatest increase in the degree of match is selected based on the obtained multiple evaluation values. The RF power supply 31 uses the multiple frequencies included in the selected time series $TS_M$ as the frequencies of the radio-frequency power RF for the respective multiple phase periods SP in each cycle CY. Upon completion of step STd21, step ST3B may end. In some embodiments, step STd21 may be followed by step STe21, in which step ST3A is performed using the time series $TS_M$ selected in step STd21 as a reference time series.

Third Example

Figure 11:
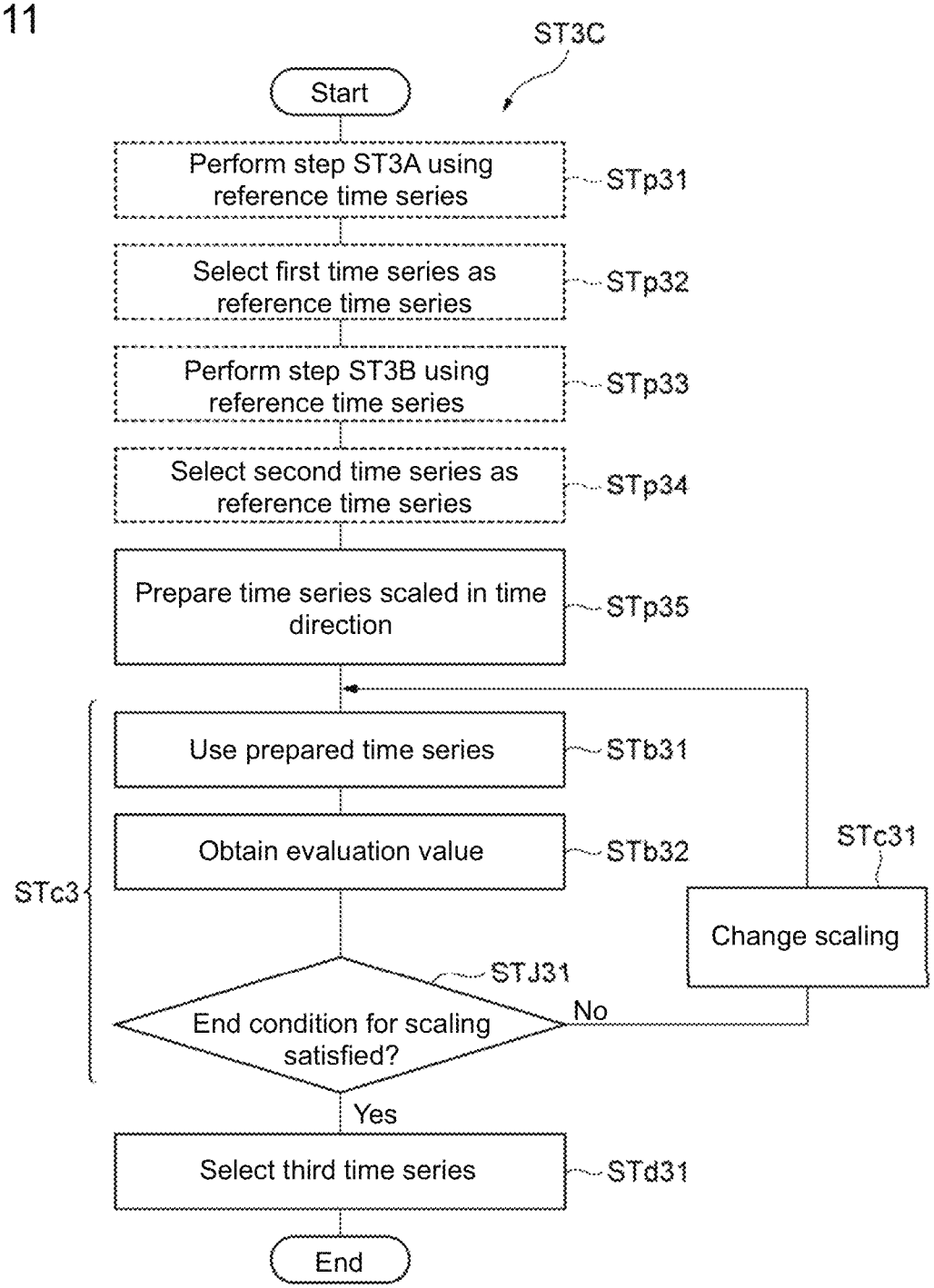
FIG. 11 is a flowchart of a plasma processing method according to one exemplary embodiment, showing step ST3 in a third example.
Figure 12:
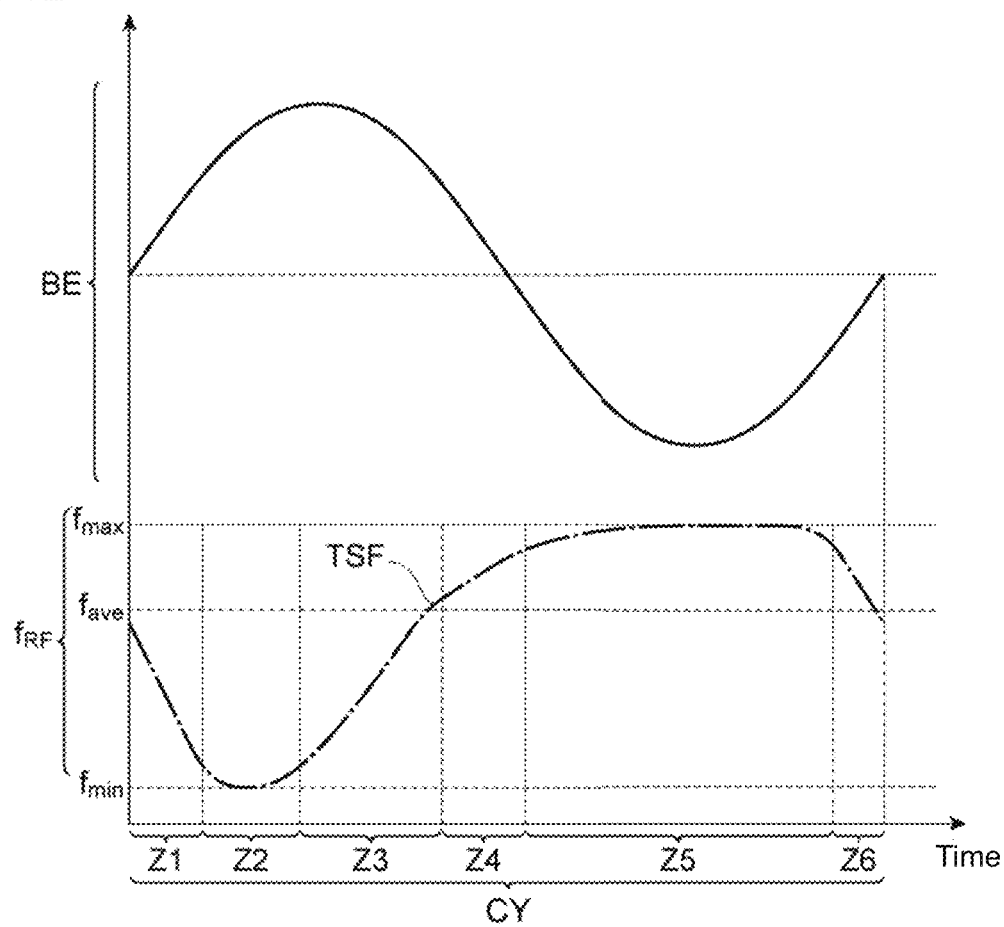
FIG. 12 is a graph describing step ST3 in the third example shown in FIG. 11.

Step ST3 in a third example will now be described with reference to FIGS. 11 and 12. FIG. 11 is a flowchart of a plasma processing method according to one exemplary embodiment, showing step ST3 in the third example. FIG. 12 is a graph describing step ST3 in the third example shown in FIG. 11. In FIG. 12, the horizontal axis indicates time, and the vertical axis indicates the electrical bias energy BE and the frequency $f_{RF}$ of the radio-frequency power RF. FIG. 12 shows the waveform of the electrical bias energy BE in a cycle CY. FIG. 12 also shows the reference time series $TS_B$ and changed time series $TS_M$ used as the frequencies $f_{RF}$ of the radio-frequency power RF for the respective multiple phase periods SP in the cycle CY. In step ST3 (step ST3C) in the third example, the time series TS3 described above is used as the changed time series $TS_M$.

Step ST3C starts from step STp31. In step STp31, step ST3A is performed using the reference time series $TS_B$. Step STp32 is then performed. In step STp32, the time series $TS_M$ (first time series) that causes the greatest increase in the degree of match is identified in the multiple time series used in step STp31 based on the multiple evaluation values obtained in step STp31. The identified time series $TS_M$ is selected as a reference time series.

Step STp33 is then performed. In step STp33, step ST3B is performed using the reference time series selected in step STp32. Step STp34 is then performed. In step STp34, the time series $TS_M$ (second time series) that causes the greatest increase in the degree of match is identified in the multiple time series used in step STp33 based on the multiple evaluation values obtained in step STp33. The identified time series $TS_M$ is selected as a reference time series.

Step STp35 is then performed. In step STp35, the time series $TS_M$ is prepared by scaling (scaling up or down), in the time direction, two or more of the multiple time zones of the reference time series selected in step STp34. The changed time series $TS_M$ includes as many frequencies as the reference time series $TS_B$. In step STp35, the time series $TS_M$ is prepared by the controller 30c. Steps STp31 to STp34 may be replaced with steps STa11 and STa12, followed by step STp35 in which the reference time series $TS_B$ may be used.

The multiple time zones may include zones Z1 to Z6 as shown in FIG. 12. To determine the zones Z1 to Z6, the minimum frequency $f_{min}$, the maximum frequency $f_{max}$, and the average frequency $f_{ave}$ of the reference time series used in step STp35 are identified. The difference between the minimum frequency $f_{min}$ and the maximum frequency $f_{max}$ in the reference time series, or the frequency width, is determined. The time zone corresponding to the range from the minimum frequency $f_{min}$ to the minimum frequency $f_{min}$ plus 10% of the frequency width is determined to be the zone Z2. The time zone corresponding to the range from the maximum frequency $f_{max}$ minus 10% of the frequency width to the maximum frequency $f_{max}$ is determined to be the zone Z5. The time zone from the start point of the cycle CY to the start point of the zone Z2 is determined to be the zone Z1. The time zone from the end point of the zone Z2 to the point corresponding to the average frequency $f_{ave}$ is determined to be the zone Z3. The time zone from the point corresponding to the average frequency $f_{ave}$ to the start point of the zone Z5 is determined to be the zone Z4. The time zone from the end point of the zone Z5 to the end point of the cycle CY is determined to be the zone Z6.

In step STp35, the zone Z2 of the reference time series may be scaled up in the time direction. The zone Z1 and the zone Z3 of the reference time series may be scaled down in the time direction to generate the changed time series $TS_M$ including as many frequencies as the reference time series $TS_B$.

Step STb31 is then performed. In step STb31, the prepared time series $TS_M$ is used as the frequencies $f_{RF}$ of the radio-frequency power RF in each cycle CY, as described above with reference to step STb. In step STc3, step STb31 is repeated. In repeated step STb31, the RF power supply 31 changes the scaling factor in the time direction for two or more of the multiple time zones of the reference time series.

In step STc3, step STb31 is followed by step STb32. Step STb32 is the same as step STb12. Step STJ31 is then performed. In step STJ31, the determination is performed as to whether an end condition for scaling is satisfied. In step STJ31, the end condition for scaling is satisfied when step STb31 has been repeated a predetermined number of times.

When the end condition for scaling is not satisfied in step STJ31, step STc31 is performed. In step STc31, the scaling factor is changed in the time direction for two or more of the multiple time zones of the reference time series, thus preparing the time series $TS_M$. The time series $TS_M$ is prepared by the controller 30c and specified for the RF power supply 31. When the end condition for scaling is satisfied in step STJ31, step STd31 (described later) is performed.

In repeated step STb31, the zone Z2 of the reference time series may be scaled up in the time direction, and the zones Z1 and Z3 of the reference time series may be scaled down in the time direction while the scaling factor for the zone Z2 is being changed in the time direction, similarly to step STp35. This process is performed until the degree of match is determined to be no longer increased based on the evaluation value obtained in step STb32.

In repeated step STb31, the zone Z5 of the reference time series may then be scaled up in the time direction, and the zones Z4 and Z6 of the reference time series may be scaled down in the time direction while the scaling factor for the zone Z5 is being changed in the time direction. This process is performed until the degree of match is determined to be no longer increased based on the evaluation value obtained in step STb32.

In step STd31, the time series $TS_M$ that causes the greatest increase in the degree of match is identified based on the multiple evaluation values obtained in step STc3. The identified time series $TS_M$ is selected as a third time series. The third time series is selected by the controller 30c in step STd31. The RF power supply 31 uses the multiple frequencies included in the selected time series (third time series) as the frequencies of the radio-frequency power RF for the respective multiple phase periods SP in each cycle CY. The processing in step STp31 and subsequent steps may be repeated using the third time series as a reference time series.

As described above, the plasma processing apparatus 1 changes the time series of frequencies $f_{RF}$ of the radio-frequency power RF in each cycle CY between the time series TS1, the time series TS2, and the time series TS3 in repeated step STb to increase the degree of match based on the evaluation value. These time series are easily obtained based on the reference time series $TS_B$. The apparatus can thus easily reduce reflection of the radio-frequency power RF used for generating plasma.

Preparing the reference time series $TS_B$ in the frequency setting period $P_{fset}$ in some embodiments will now be described. The reference time series $TS_B$ is prepared using a reference plasma processing apparatus. The reference plasma processing apparatus has substantially the same structure as the plasma processing apparatus 1. However, the reference plasma processing apparatus includes a controller 30c with the processing capability to detect the degree of match and determine the frequency of the radio-frequency power RF for each of the multiple phase periods SP in each cycle CY. Preparing the reference time series $TS_B$ in the reference plasma processing apparatus is described below using the same reference numerals for the components of the reference plasma processing apparatus as for the corresponding components of the plasma processing apparatus 1.

Determining Frequencies $f_{RF}$ in First Embodiment

Figure 13:
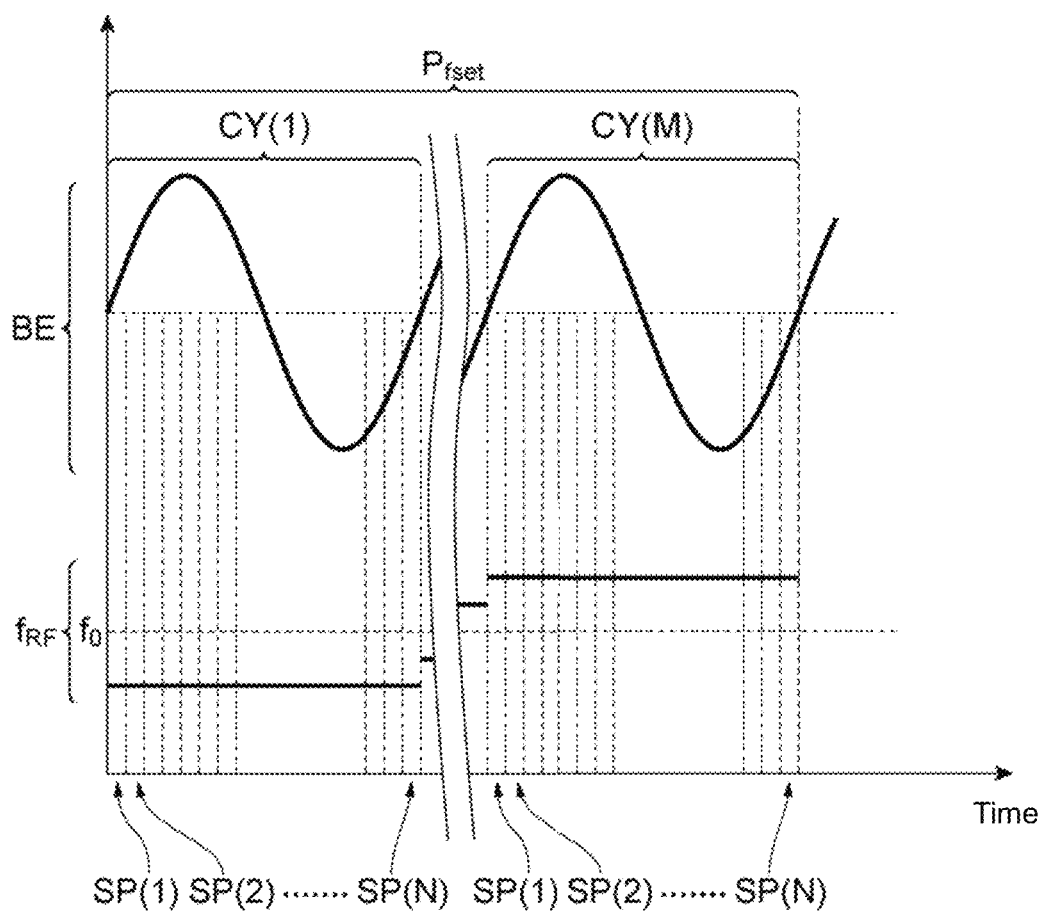
FIG. 13 is an example timing chart for a frequency setting period in the plasma processing apparatus according to one exemplary embodiment.

FIG. 13 is an example timing chart for a frequency setting period in the plasma processing apparatus according to one exemplary embodiment. As shown in FIG. 13, the frequency setting period $P_{fset}$ in the first embodiment includes multiple cycles CY (M cycles CY(1) to CY(M)). Each of the multiple cycles CY includes N phase periods SP(1) to SP(N). In other words, each of the multiple cycles CY is divided into the N phase periods SP(1) to SP(N), where N is an integer greater than or equal to 2. The multiple phase periods SP in each of the multiple cycles CY have time lengths that may be the same as or different from one another. A phase period SP(n) herein refers to the n-th phase period of the phase periods SP(1) to SP(N). A phase period SP(m, n) refers to the n-th phase period in the m-th cycle CY(m) of the multiple cycles CY.

The controller 30c controls the RF power supply 31 to set multiple frequencies different from each other as the frequencies of the radio-frequency power RF in the identical phase periods SP(n) in the multiple cycles CY. The controller 30c selects, from the multiple frequencies, an appropriate frequency minimizing a power level Pr of the reflected wave of the radio-frequency power RF in each of the multiple phase periods SP to determine multiple appropriate frequencies of the radio-frequency power for the respective multiple phase periods SP.

In the example in FIG. 13, the cycles CY(1) to CY(M) have predetermined frequencies of the radio-frequency power RF that are different from each other. The power level Pr of the reflected wave of the radio-frequency power RF in each of the phase periods SP(1) to SP(N) in each of the cycles CY(1) to CY(M) is then obtained. Based on the obtained power levels Pr of the reflected waves, the appropriate frequency of the radio-frequency power RF minimizing the power level Pr of the reflected wave is selected for each of the phase periods SP(1) to SP(N). The appropriate frequencies of the radio-frequency power RF for the respective phase periods SP(1) to SP(N) define the reference time series $TS_B$. The reference time series $TS_B$ prepared in the reference plasma processing apparatus is provided to the controller 30c in the plasma processing apparatus 1 before plasma processing is performed.

Determining Frequencies $f_{RF}$ in Second Embodiment

Figure 14:
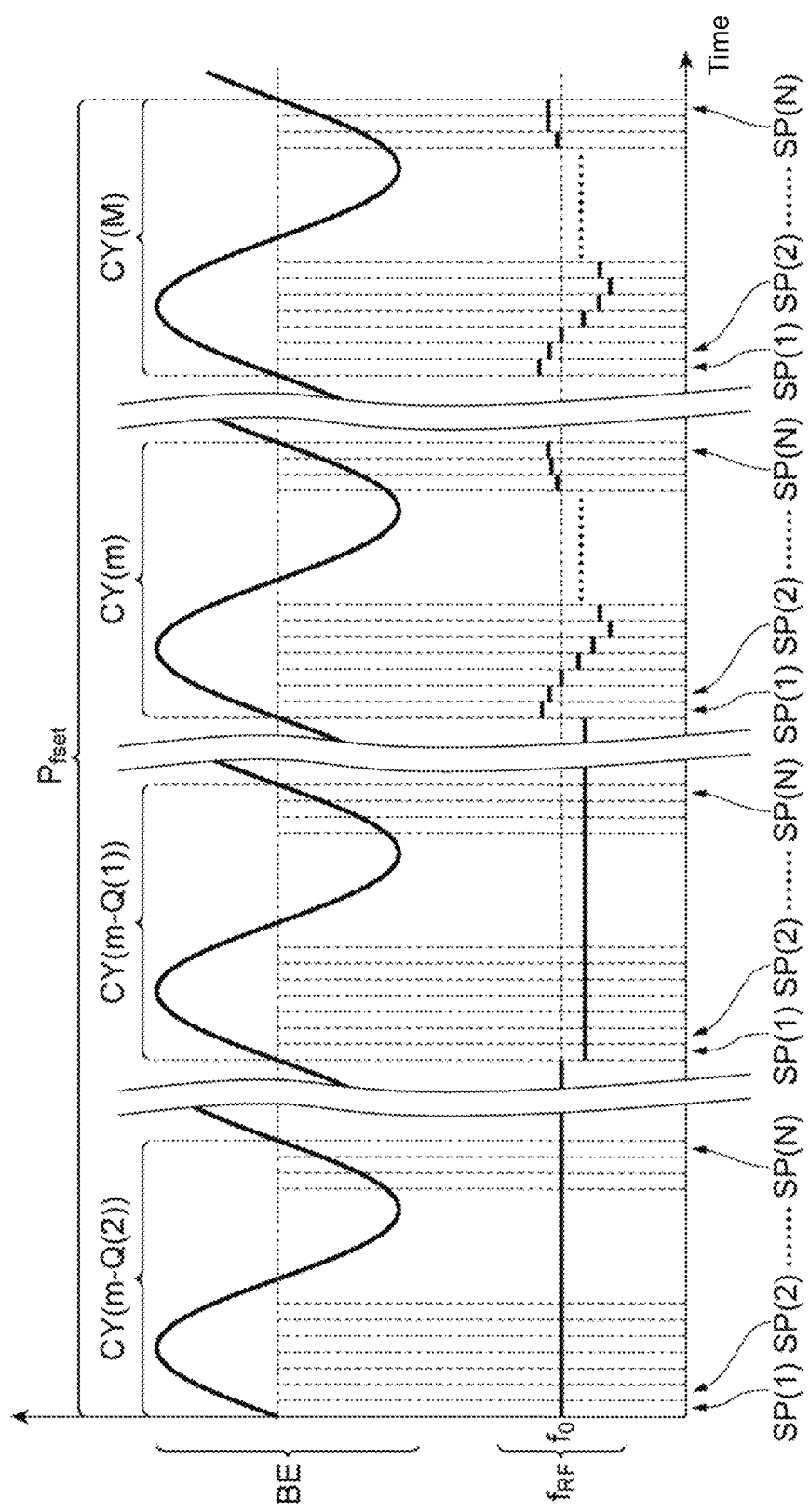
FIG. 14 is an example timing chart for a frequency setting period in the plasma processing apparatus according to one exemplary embodiment.

FIG. 14 is an example timing chart for a frequency setting period in the plasma processing apparatus according to one exemplary embodiment. As shown in FIG. 14, the frequency setting period $P_{fset}$ in the second embodiment includes multiple cycles CY (M cycles CY(1) to CY(M)).

The controller 30c adjusts the frequency of the radio-frequency power RF in the phase period SP(n) in the cycle CY(m), or the phase period SP(m, n), based on a change in the power level Pr of the reflected wave of the radio-frequency power RF. The change in the power level Pr of the reflected wave is identified with the frequency of the radio-frequency power RF being set differently in the corresponding phase period SP(n) in each of two or more cycles CY preceding the cycle CY(m).

In one embodiment, the two or more cycles CY preceding the cycle CY(m) include a first cycle and a second cycle. In the example in FIG. 14, the first cycle is the cycle CY(m−Q(2)), and the second cycle is the cycle CY(m−Q(1)) subsequent to the first cycle. The value Q(1) is an integer greater than or equal to 1, the value Q(2) is an integer greater than or equal to 2, and Q(1)<Q(2).

The controller 30c sets the frequency f(m−Q(1), n) of the radio-frequency power RF in the phase period SP(m−Q(1), n) to a frequency resulting from a frequency shift in a first direction from the frequency of the radio-frequency power RF in the phase period SP(m−Q(2), n). The symbol f(m, n) indicates the frequency of the radio-frequency power RF in the phase period SP(m, n), and is expressed as f(m, n)=f(m−Q(1), n)+Δ(m, n), where Δ(m, n) is a frequency shift amount. The frequency shift in the first direction is either a decrease or an increase in the frequency. When the frequency shift in the first direction is a decrease in the frequency, Δ(m, n) has a negative value. When the frequency shift in the first direction is an increase in the frequency, Δ(m, n) has a positive value.

In FIG. 14, the multiple phase periods SP in the cycle CY(m−Q(2)) have the same frequency of the radio-frequency power RF, or specifically, $f_0$, but may have different frequencies. In FIG. 14, the multiple phase periods SP in the cycle CY(m−Q(1)) have the same frequency of the radio-frequency power RF, or specifically, a frequency decreased from $f_0$, but may have a frequency increased from $f_0$.

When the power level Pr(m−Q(1), n) decreases from the power level Pr(m−2Q, n) in response to a frequency shift in the first direction, the controller 30c sets the frequency f(m, n) to a frequency resulting from a frequency shift in the first direction from the frequency f(m−Q, n). The symbol Pr(m, n) indicates the power level Pr of the reflected wave of the radio-frequency power RF in the phase period SP(m, n).

The frequency shift amount Δ(m, n) in the first direction in the phase period SP(m, n) may be the same as the frequency shift amount Δ(m−Q(1), n) in the first direction in the phase period SP(m−Q(1), n). More specifically, the frequency shift amount Δ(m, n) may have the same absolute value as the frequency shift amount Δ(m−Q(1), n). In some embodiments, the frequency shift amount Δ(m, n) may have a greater absolute value than the frequency shift amount Δ(m−Q(1), n). In some embodiments, the frequency shift amount Δ(m, n) may have a greater absolute value for a greater power level Pr(m−Q(1), n) of the reflected wave in the phase period SP(m−Q(1), n). For example, the frequency shift amount Δ(m, n) may have the absolute value determined by a function of the power level Pr(m−Q(1), n) of the reflected wave.

The power level Pr(m−Q(1), n) of the reflected wave can increase from the power level Pr(m−Q(2), n) of the reflected wave in response to a frequency shift in the first direction. In this case, the controller 30c may set the frequency f(m, n) to a frequency resulting from a frequency shift in a second direction from the frequency f(m−Q(1), n). The frequency of the radio-frequency power RF in the phase period SP(n) in each of two or more cycles preceding the cycle CY(m) may be updated to be a frequency resulting from a frequency shift in the first direction from the frequency of the radio-frequency power RF in the phase period SP(n) in its corresponding preceding cycle. In this case, for an upward trend of the power level Pr of the reflected wave in the phase period SP(n) in each of the two or more cycles or for an upward trend of the average power level Pr in the phase periods SP(n) in these cycles, the frequency of the radio-frequency power RF in the phase period SP(n) in the cycle CY(m) may be set to a frequency resulting from a frequency shift in the second direction. For example, the frequency of the radio-frequency power RF in the phase period SP(n) in the cycle CY(m) may be set to a frequency resulting from a frequency shift in the second direction from the frequency of the radio-frequency power in the earliest of the two or more cycles.

When the power level Pr(m, n) of the reflected wave increases from the power level Pr(m−Q(1), n) of the reflected wave in response to a frequency shift in the first direction, the controller 30c may set the frequency of the radio-frequency power RF in the phase period SP(n) in the waveform cycle CY(m+Q(1)) to an intermediate frequency. The cycle CY(m+Q(1)) is a third cycle subsequent to the cycle CY(m). The intermediate frequency that may be set in the phase period SP(m+Q(1), n) is between the frequencies f(m−Q(1), n) and f(m, n), and may be the average of the frequencies f(m−Q(1), n) and f(m, n).

The power level Pr can exceed a predetermined threshold when the intermediate frequency is set in the phase period SP(m+Q(1), n). In this case, the controller 30c may set the frequency of the radio-frequency power RF in the phase period SP(n) in the cycle CY(m+Q(2)) to a frequency resulting from a frequency shift in the second direction from the intermediate frequency. The cycle CY(m+Q(2)) is a fourth cycle subsequent to the cycle CY(m+Q(2)). The threshold is predetermined. The frequency shift amount Δ(m+Q(2), n) in the second direction has a greater absolute value than the frequency shift amount Δ(m, n) in the first direction. This avoids the situation in which the power level Pr of the reflected wave fails to decrease from a local minimum value. The thresholds for the respective multiple phase periods SP in each of the multiple cycles CY may be the same as or different from one another.

In the second embodiment, the appropriate frequency of the radio-frequency power RF is set for each of the phase periods SP(1) to SP(N) in the cycle CY(M) in the frequency setting period $P_{fset}$. The appropriate frequencies of the radio-frequency power RF for the respective phase periods SP(1) to SP(N) define the reference time series $TS_B$. The reference time series $TS_B$ prepared in the reference plasma processing apparatus is provided to the controller 30c in the plasma processing apparatus 1 before plasma processing is performed.

Although the exemplary embodiments have been described above, the embodiments are not restrictive, and various additions, omissions, substitutions, and changes may be made. The components in the different embodiments may be combined to form another embodiment.

In other embodiments, the plasma processing apparatus may be an ICP plasma processing apparatus, an ECR plasma processing apparatus, an HWP plasma processing apparatus, or an SWP plasma processing apparatus. Any of these plasma processing apparatuses uses the radio-frequency power RF to generate plasma.

Various exemplary embodiments E1 to E10 included in the present disclosure will now be described.

E1

A plasma processing apparatus, comprising:
a chamber;
a substrate support in the chamber;
a radio-frequency power supply configured to provide radio-frequency power to generate plasma from a gas in the chamber; and
a bias power supply configured to provide electrical bias energy to the substrate support to draw ions toward a substrate on the substrate support, the electrical bias energy having a waveform with repeated cycles each having a time length being an inverse of a bias frequency,
wherein while the radio-frequency power is being provided and the electrical bias energy is being provided to the substrate support, the radio-frequency power supply performs
(a) using a predetermined reference time series of frequencies of the radio-frequency power in each of the repeated cycles,
(b) using, after (a), a changed time series of frequencies of the radio-frequency power in each of the repeated cycles, and
(c) repeating (b) to increase a degree of match of impedance between the radio-frequency power supply and a load coupled to the radio-frequency power supply based on an evaluation value indicating the degree of match, and
the changed time series usable by the radio-frequency power supply in (b) is
a time series (TS1) of frequencies resulting from shifting the reference time series by a phase shift amount for each of the repeated cycles,
a time series (TS2) of frequencies resulting from scaling up or down the reference time series in a frequency direction, or
a time series (TS3) of frequencies resulting from scaling up or down two or more of a plurality of time zones of the reference time series in a time direction and including as many frequencies as the reference time series.

In the embodiment E1, the time series of frequencies of the radio-frequency power in each bias cycle is changed between the time series (TS1), the time series (TS2), and the time series (TS3) in the repeat of (b) to increase the degree of match based on the evaluation value. These time series are easily obtained based on the reference time series. The plasma processing apparatus according to the above embodiment can thus easily reduce reflection of the radio-frequency power used for generating plasma.

E2

The plasma processing apparatus according to E1, wherein
in a repeat of (b), the radio-frequency power supply changes the phase shift amount.

E3

The plasma processing apparatus according to E1, wherein
in a repeat of (b), the radio-frequency power supply changes a factor for the scaling up or down using at least one of
a time series of frequencies of the radio-frequency power resulting from scaling up or down the reference time series in the frequency direction while maintaining a minimum frequency in the reference time series,
a time series of frequencies of the radio-frequency power resulting from scaling up or down the reference time series in the frequency direction while maintaining a maximum frequency in the reference time series,
a time series of frequencies of the radio-frequency power resulting from scaling up or down the reference time series in the frequency direction while maintaining frequencies lower than or equal to a specified frequency in the reference time series, or
a time series of frequencies of the radio-frequency power resulting from scaling up or down the reference time series in the frequency direction while maintaining frequencies higher than or equal to the specified frequency in the reference time series.

E4

The plasma processing apparatus according to E3, wherein
the radio-frequency power supply selects, from a plurality of time series of frequencies of the radio-frequency power used in the repeat of (b), a first time series causing a greatest increase in the degree of match based on the evaluation value,
further repeats (b) using a second time series of frequencies resulting from shifting the first time series by a phase shift amount for each of the repeated cycles, and
changes the phase shift amount in further repeating (b).

E5

The plasma processing apparatus according to E1, wherein
in a first repeat of (b), the radio-frequency power supply changes the phase shift amount and selects, from a plurality of time series of frequencies of the radio-frequency power used in the first repeat of (b), a first time series of frequencies causing a greatest increase in the degree of match based on the evaluation value,
in a second repeat of (b), the radio-frequency power supply changes a factor for the scaling up or down using at least one of a time series of frequencies of the radio-frequency power resulting from scaling up or down the first time series in the frequency direction while maintaining a minimum frequency in the first time series, a time series of frequencies of the radio-frequency power resulting from scaling up or down the first time series in the frequency direction while maintaining a maximum frequency in the first time series, a time series of frequencies of the radio-frequency power resulting from scaling up or down the first time series in the frequency direction while maintaining frequencies lower than or equal to a specified frequency in the first time series, or a time series of frequencies of the radio-frequency power resulting from scaling up or down the first time series in the frequency direction while maintaining frequencies higher than or equal to the specified frequency in the first time series, and selects, from a plurality of time series of frequencies of the radio-frequency power used in the second repeat of (b), a second time series of frequencies causing a greatest increase in the degree of match based on the evaluation value, and in a third repeat of (b), the radio-frequency power supply changes a factor for the scaling up or down in the time direction using a time series of frequencies resulting from scaling up or down each of a plurality of time zones of the second time series in the time direction and including as many frequencies as the second time series, and selects, from a plurality of time series of frequencies of the radio-frequency power used in the third repeat of (b), a third time series of frequencies causing a greatest increase in the degree of match based on the evaluation value.

E6

The plasma processing apparatus according to any one of E1 to E5, wherein the evaluation value is a single representative value in a period longer than or equal to the time length of each of the repeated cycles.

E7

The plasma processing apparatus according to E6, wherein the evaluation value is a representative value of power levels of reflected waves of the radio-frequency power returning to the radio-frequency power supply from the load coupled to the radio-frequency power supply or a representative value of ratios of the power levels of the reflected waves to an output level of the radio-frequency power of the radio-frequency power supply.

E8

The plasma processing apparatus according to E6, wherein the evaluation value is a representative value of phase differences between voltages and currents of the radio-frequency power measured between the radio-frequency power supply and the load coupled to the radio-frequency power supply, a representative value of impedances determined based on the voltages and the currents, or a representative value of resistive components of the impedances.

E9

The plasma processing apparatus according to any one of E1 to E8, wherein the electrical bias energy includes radio-frequency bias power or voltage pulses periodically generated at a time interval with a time length being the inverse of the bias frequency.

E10

A plasma processing method, comprising:

providing radio-frequency power from a radio-frequency power supply to generate plasma from a gas in a chamber in a plasma processing apparatus, the plasma processing apparatus including a substrate support in the chamber;

providing electrical bias energy to the substrate support to draw ions toward a substrate on the substrate support, the electrical bias energy having a waveform with repeated cycles each having a time length being an inverse of a bias frequency; and adjusting frequencies of the radio-frequency power in each of the repeated cycles while the radio-frequency power is being provided and the electrical bias energy is being provided to the substrate support, wherein the adjusting the frequencies includes
 (a) using a predetermined reference time series of frequencies of the radio-frequency power in each of the repeated cycles,
 (b) using, after (a), a changed time series of frequencies of the radio-frequency power in each of the repeated cycles, and
 (c) repeating (b) to increase a degree of match of impedance between the radio-frequency power supply and a load coupled to the radio-frequency power supply based on an evaluation value indicating the degree of match, and the changed time series usable in (b) is
 a time series of frequencies resulting from shifting the reference time series by a phase shift amount for each of the repeated cycles,
 a time series of frequencies resulting from scaling up or down the reference time series in a frequency direction, or
 a time series of frequencies resulting from scaling up or down two or more of a plurality of time zones of the reference time series in a time direction and including as many frequencies as the reference time series.

The exemplary embodiments according to the present disclosure have been described by way of example, and various changes may be made without departing from the scope and spirit of the present disclosure. The exemplary embodiments disclosed above are thus not restrictive, and the true scope and spirit of the present disclosure are defined by the appended claims.

REFERENCE SIGNS LIST

1 Plasma processing apparatus
10 Chamber
11 Substrate support
31 RF power supply
32 Bias power supply
30c Controller

The invention claimed is:

1. A plasma processing method, comprising:

providing radio-frequency power from a radio-frequency power supply to generate plasma from a gas in a chamber in a plasma processing apparatus, the plasma processing apparatus including a substrate support in the chamber;

providing electrical bias energy to the substrate support to draw ions toward a substrate on the substrate support, the electrical bias energy having a waveform with repeated cycles each having a time length being an inverse of a bias frequency; and adjusting frequencies of the radio-frequency power in each of the repeated cycles while the radio-frequency power is being provided and the electrical bias energy is being provided to the substrate support, wherein the adjusting the frequencies includes
  (a) using a predetermined reference time series of frequencies of the radio-frequency power in each of the repeated cycles,
  (b) using, after the (a), a changed time series of frequencies of the radio-frequency power in each of the repeated cycles, and
  (c) repeating the (b) to increase a degree of match of impedance between the radio-frequency power supply and a load coupled to the radio-frequency power supply based on an evaluation value indicating the degree of match, and the changed time series used in the (b) is
  a time series of frequencies resulting from shifting the reference time series by a phase shift amount for each of the repeated cycles,
  a time series of frequencies resulting from scaling up or down the reference time series in a frequency direction, or
  a time series of frequencies resulting from scaling up or down two or more of a plurality of time zones of the reference time series in a time direction and including as many frequencies as the reference time series.

2. The plasma processing method according to claim 1, further comprising:
  in the repeating of the (b), changing the phase shift amount.

3. The plasma processing method according to claim 1, further comprising:
  in the repeating of the (b), changing a factor for the scaling up or down using at least one of
    a time series of frequencies of the radio-frequency power resulting from scaling up or down the reference time series in the frequency direction while maintaining a minimum frequency in the reference time series,
    a time series of frequencies of the radio-frequency power resulting from scaling up or down the reference time series in the frequency direction while maintaining a maximum frequency in the reference time series,
    a time series of frequencies of the radio-frequency power resulting from scaling up or down the reference time series in the frequency direction while maintaining frequencies lower than or equal to a specified frequency in the reference time series, or
    a time series of frequencies of the radio-frequency power resulting from scaling up or down the reference time series in the frequency direction while maintaining frequencies higher than or equal to the specified frequency in the reference time series.

4. The plasma processing method according to claim 3, further comprising:
  selecting, from a plurality of time series of frequencies of the radio-frequency power used in the repeating of the (b), a first time series causing a greatest increase in the degree of match based on the evaluation value;
  further repeating the (b) using a second time series of frequencies resulting from shifting the first time series by a phase shift amount for each of the repeated cycles; and
  changing the phase shift amount in further repeating the (b).

5. The plasma processing method according to claim 1, wherein
  in a first repeat of the (b), the method changes the phase shift amount and selects, from a plurality of time series of frequencies of the radio-frequency power used in the first repeat of the (b), a first time series of frequencies causing a greatest increase in the degree of match based on the evaluation value,
  in a second repeat of the (b), the method changes a factor for the scaling up or down using at least one of
    a time series of frequencies of the radio-frequency power resulting from scaling up or down the first time series in the frequency direction while maintaining a minimum frequency in the first time series,
    a time series of frequencies of the radio-frequency power resulting from scaling up or down the first time series in the frequency direction while maintaining a maximum frequency in the first time series,
    a time series of frequencies of the radio-frequency power resulting from scaling up or down the first time series in the frequency direction while maintaining frequencies lower than or equal to a specified frequency in the first time series, or
    a time series of frequencies of the radio-frequency power resulting from scaling up or down the first time series in the frequency direction while maintaining frequencies higher than or equal to the specified frequency in the first time series, and
  the method selects, from a plurality of time series of frequencies of the radio-frequency power used in the second repeat of the (b), a second time series of frequencies causing a greatest increase in the degree of match based on the evaluation value, and
  in a third repeat of the (b), the method changes a factor for the scaling up or down in the time direction using a time series of frequencies resulting from scaling up or down each of a plurality of time zones of the second time series in the time direction and including as many frequencies as the second time series, and selects, from a plurality of time series of frequencies of the radio-frequency power used in the third repeat of the (b), a third time series of frequencies causing a greatest increase in the degree of match based on the evaluation value.

6. The plasma processing method according to claim 1, wherein
  the evaluation value is a single representative value in a period longer than or equal to the time length of each of the repeated cycles.

7. The plasma processing apparatus according to claim 6, wherein
  the evaluation value is a representative value of power levels of reflected waves of the radio-frequency power returning to the radio-frequency power supply from the load coupled to the radio-frequency power supply or a representative value of ratios of the power levels of the reflected waves to an output level of the radio-frequency power of the radio-frequency power supply.

8. The plasma processing apparatus according to claim 6, wherein the evaluation value is a representative value of phase differences between voltages and currents of the radio-frequency power measured between the radio-frequency power supply and the load coupled to the radio-frequency power supply, a representative value of impedances determined based on the voltages and the currents, or a representative value of resistive components of the impedances.

9. The plasma processing method according to claim 1, wherein the electrical bias energy includes radio-frequency bias power or voltage pulses periodically generated at a time interval with a time length being the inverse of the bias frequency.

* * * * *